United States Patent
Nickel et al.

(10) Patent No.: US 8,658,463 B2
(45) Date of Patent: Feb. 25, 2014

(54) MEMRISTOR WITH EMBEDDED SWITCHING LAYER

(75) Inventors: Janice H. Nickel, Sunnyvale, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/562,063

(22) Filed: Jul. 30, 2012

(65) Prior Publication Data

US 2014/0027700 A1   Jan. 30, 2014

(51) Int. Cl.

| | |
|---|---|
| *H01L 21/00* | (2006.01) |
| *H01L 21/16* | (2006.01) |
| *H01L 21/20* | (2006.01) |
| *H01L 47/00* | (2006.01) |
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |

(52) U.S. Cl.
USPC ............ 438/104; 438/381; 438/382; 257/3; 257/143; 257/E21.003; 257/E21.459; 257/E45.003

(58) Field of Classification Search
USPC .............. 438/381, 382, 104; 257/3, 143, 257/E21.003, E21.459, E45.003
See application file for complete search history.

(56) References Cited

U.S. PATENT DOCUMENTS

| | | | |
|---|---|---|---|
| 7,629,247 B2 | 12/2009 | Hsia et al. | |
| 7,927,977 B2 | 4/2011 | Makala et al. | |
| 2009/0289251 A1 | 11/2009 | Kiyotoshi | |
| 2010/0065804 A1 | 3/2010 | Park | |
| 2011/0038196 A1* | 2/2011 | Tour et al. | 365/148 |
| 2011/0068316 A1 | 3/2011 | Takano et al. | |
| 2011/0182103 A1 | 7/2011 | Smythe et al. | |
| 2011/0183475 A1 | 7/2011 | Purayath et al. | |
| 2011/0242874 A1 | 10/2011 | Chien et al. | |
| 2012/0252183 A1* | 10/2012 | Herner | 438/382 |
| 2013/0221307 A1* | 8/2013 | Wang et al. | 257/2 |

FOREIGN PATENT DOCUMENTS

JP   2007220768   8/2007

OTHER PUBLICATIONS

Yoshida, Chikako, et al., High speed resistive switching in Pt/TiO2/TiN film for nonvolatile memory application, Applied Physics Letters, 2007, pp. 223510-1 to 223510-3, 91.

Chang Seok Kang, et al, Characterization of resistivity and work function of sputtered-TaN film for gate electrode applications, Journal of Vacuum Science Technology, 2003, pp. 2026-2028, B 21.

International Search Report, Aug. 7, 2012, PCT Application No. PCT/US2011/064429.

* cited by examiner

*Primary Examiner* — David S Blum

(57) ABSTRACT

A method of making a memristor having an embedded switching layer include exposing a surface portion of a first electrode material within a via to a reactive species to form the switching layer embedded within and at surface of the via. The via is in contact with a first conductor trace. The method further includes depositing a layer of a second electrode material adjacent to the via surface and patterning the layer into a column aligned with the via. The method further includes depositing an interlayer dielectric material to surround the column and providing a second conductor trace in electrical contact with the second electrode material of the column.

15 Claims, 7 Drawing Sheets

MEMRISTOR WITH EMBEDDED SWITCHING LAYER

CROSS-REFERENCE TO RELATED APPLICATIONS

N/A

STATEMENT REGARDING FEDERALLY SPONSORED RESEARCH OR DEVELOPMENT

N/A

BACKGROUND

A memristor, as well as various related metal-oxide-metal structures, is an electrical device having or exhibiting an instantaneous device state (e.g., a resistance state) that is a function substantially of bias history. In particular, a bias (e.g., a voltage or a current) applied across terminals of the memristor may be used to set, select or program the device state of the memristor. Once programmed, the memristor may retain the programmed device state for a specified period of time after the bias is removed. As such, the memristor is a two-terminal device that may function as a non-volatile memory where the programmed device state stores information.

In some examples, the memristor may be switched between a specific pair of device states using a programming signal. For example, the memristor may be switched to a first or 'ON' device state (e.g., a relatively low resistance state) by a first condition of the programming signal. Alternatively, the memristor may be switched to a second or 'OFF' device state (e.g., a relatively high resistance state) by a second condition of the programming signal. Such switching between specific device states of the pair of device states may be used to implement a binary memory cell or element, for example. Further, a plurality of memristors may be arranged in an array (e.g. a cross-bar array) to serve as a binary memory for storing data in a computer system or as programmable logic, according to various applications.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1A:
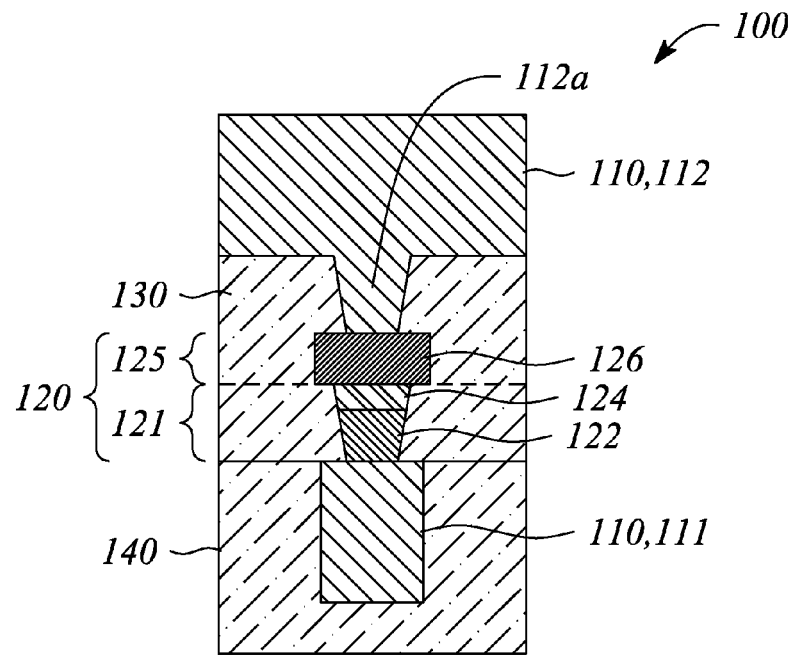
FIG. 1A illustrates a cross sectional view of a memristor, according to an example consistent with the principles described herein.

Certain embodiments of the present invention have other features that are one of in addition to and in lieu of the features illustrated in the above-referenced figures. These and other features of the invention are detailed below with reference to the preceding drawings.

DETAILED DESCRIPTION

Examples in accordance with the principles described herein provide a memristor with an embedded switching layer and methods of making the same. In particular, the memristor includes a memristor bit that extends between a pair of elongated conductor traces, where the memristor bit includes an electrode in a column portion and a switching layer embedded with or in an electrode in a via portion of the bit. The switching layer is a reacted species of an electrode material that fills the via and is embedded in a surface of the via. The embedded switching layer eliminates one or more manufacturing steps to create a switching layer in the memristor bit. For example, a deposition step and the associated separate layer of a switching material are eliminated. Moreover, in some examples, the embedded switching layer is more centrally located in the memristor bit and is better protected during manufacturing from contamination and various process chemicals. In some examples, the column portion further includes a vacancy reservoir layer directly adjacent to the switching layer in the via portion. In some examples, the embedded switching layer may eliminate inclusion of the layer of a vacancy reservoir material that is positioned adjacent to the switching layer. In some examples, a simplified structure of the memristor according to the principles herein provides manufacturing cost savings without compromising performance of the memristor.

As used herein, a memristor comprises a memristor bit between a pair of conductor traces. The 'memristor bit' is an active component of the memristor and includes electrodes at opposite ends of the bit and at least the embedded switching layer between the electrodes. The conductor traces of the memristor are in electrical contact with the electrodes of the memristor bit at the opposite ends thereof. In accordance with the principles herein, the memristor bit is defined as including a via portion that includes a first electrode and the embedded switching layer and a column portion aligned with and in electrical contact with the via portion and that includes a second electrode layer, and in some examples, a vacancy reservoir layer. The switching layer is embedded in the via portion. By 'embedded' it is meant that the switching layer is formed in situ from a material (i.e., a first electrode material) that fills a via of the via portion, and the switching layer is a reacted species of the via fill material. In particular, the embedded switching layer occupies a portion of a space previously occupied by the via fill material in the via, and the via comprises both the reacted species portion (the switching layer) and an unreacted species portion (the first electrode material).

A 'switching layer' is defined as a layer of an electrically nonconductive material that exhibits a resistive switching phenomenon or characteristic when subjected to a stimulus (e.g., a voltage or a current). The resistive switching characteristic includes switching from a high resistance state to a low resistance state and switching from a low resistance state to a high resistance state. The switching may be a unipolar switching phenomenon or a bipolar switching phenomenon. Further by definition herein, the switching layer material comprises a stoichiometrically stable resistive material including, but not limited to, a resistive oxide, a resistive nitride, or a resistive silicide, for example.

For example, stoichiometrically stable oxides, nitrides or silicide of metals may be used that include, but are not limited to, titanium (e.g., titanium dioxide ($TiO_2$)), tantalum (e.g., ditantalum pentaoxide ($Ta_2O_5$)), hafnium, niobium, or combinations of any of the above with other metals. For example, stoichiometrically stable combinations of resistive materials that may be employed as the switching layer include, but are not limited to, nickel oxide, nickel oxide doped with chromium, strontium titanium oxide, strontium titanium oxide doped with chromium, or tungsten oxide, for example.

A 'reacted species' is defined as species derived from a reaction between an electrically conductive material and a reactive species. The reacted species is electrically nonconductive and includes a metal from the conductive material and occupies a portion of a space that the conductive material occupied before the reaction. For example, the switching layer is a reacted species of an electrode material with a reactive species. A 'reactive species' is defined as species that is highly reactive due to, for example, the presence of unpaired valence shell electrons. The reactive species is a reactant fluid that may include, a gas, a liquid, a plasma, ionizing radiation or a combination thereof. In some examples, the reactive species comprises one or more of oxygen (O), nitrogen (N), sulfur (S), carbon (C), boron (B), phosphorus (P), a combination of two or more thereof, and a combination of one or more thereof with another species. In some examples, a reactive species including, but not limited to, oxygen plasma or ozone ($O_3$) may be used to oxidize a conductive material into the reacted species. For example, titanium (Ti) or a titanium nitride (TiN) conductive material may be converted by the reactive species (e.g., $O_2$) to a titanium oxide ($Ti_xO_y$)-reacted species, or tantalum (Ta) or a tantalum nitride (TaN) conductive material may be converted by the reactive species (e.g., $O_3$) to a tantalum oxide ($Ta_xO_y$)-reacted species, for example. In still other examples, aluminum (Al), Ti, or Ta may be converted by a nitrogen-based reactive species (e.g. $N_z$) to an aluminum nitride ($Al_xN_y$)-reacted species, a $Ti_xN_y$-reacted species, or a $Ta_xN_y$-reacted species, wherein x and y are such that the reacted species is stoichiometrically stable and nonconductive, as provided above.

A 'vacancy reservoir material' is defined as an electrically conductive, off-stoichiometric material including, but not limited to, oxides and nitrides. For example, a vacancy reservoir material may be tetratitanium heptaoxide ($Ti_4O_7$) or tantalum dioxide ($TaO_2$). In some examples, the vacancy reservoir material may include materials that accommodate oxygen ions in solid solution, e.g., Ta(O).

A 'diffusion barrier material' is defined as an electrically conductive material that is substantially inert when placed as a thin layer between two other electrically conductive material layers to prevent migration or diffusion of the other materials into each other. Metals including, but not limited to, nickel, nichrome, tantalum, hafnium, niobium, zirconium, vanadium and tungsten are a few of the metals used to form diffusion barriers for specific applications. Conductive ceramics including, but not limited to, tantalum nitride, indium oxide, copper silicide, tungsten nitride and titanium nitride may be used also.

By 'conductive material' it is meant an electrically conductive material and includes, but is not limited to, electrically conductive metals, metal oxides and metal nitrides. An 'electrode material' is defined as a conductive material that is used to electrically connect to another conductive material (e.g., to a conductor trace). As used herein, an 'electrode' is a discrete connection element, for example, of a memristor bit, as compared to the 'conductor trace,' which is an elongated structure that provides connections to a plurality of the electrodes, for example in a crossbar array. The conductive material of the conductor trace includes, but is not limited to, gold (Au), silver (Ag), copper (Cu), aluminum (Al), palladium (Pd), platinum (Pt), tungsten (W) and titanium (Ti) as well as alloys thereof, for example. Other conductive metals and other conductive materials (e.g., a highly doped semiconductor) may also be employed as the conductive traces, in some examples. Moreover, the conductive material need not be the same in a first conductive trace and a second conductive trace of the pair.

The electrode material includes, but is not limited to, tantalum (Ta), tantalum nitride ($Ta_xN_y$), tantalum oxide ($Ta_xO_y$), titanium (Ti), titanium nitride ($Ti_xN_y$), titanium oxide ($Ti_xO_y$), hafnium (Hf), hafnium nitride ($Hf_xN_y$), hafnium oxide ($Hf_xO_y$), tungsten (W), tungsten nitride ($W_xN_y$), and tungsten oxide ($W_xO_y$). In some examples, x ranges from about 1 to about 4 and y ranges from about 1 to about 8, or x and y are such that the electrode material is rendered electrically conductive. Other conductive materials, including silicides and carbides of the above-listed metals, or mixtures or combinations of any of the above listed electrode materials, may be used. In some examples, a portion of the electrode material functions as or is a vacancy reservoir material. In some examples, the vacancy reservoir material is a different conductive material from the conductive material of the electrode. Moreover, the electrode material need not be the same in a first electrode and a second electrode of the memristor bit.

A 'crossbar array' is defined as at least two pluralities of conductor traces in parallel planes that are spaced apart but cross one another at nonzero angles to form cross points. A 'cross point' is defined as a point between the parallel planes of the conductor traces (oriented at nonzero angles in different directions) where a conductor trace of a first plurality crosses a conductor trace of the second plurality 'in space'. The memristor bits are located at the cross points of the crossbar array and provide an electrical connection between the respective conductor traces of the pluralities. In a crossbar array, rows of memristors are connected together with a common conductor trace that may be referred to as a 'bit line' (i.e., an elongated wire), while another bit line connects columns of memristors, for example. Parallel conductor traces may implement parallel bit lines, for example. The memristors may be separately addressable using the crossbar array of conductor traces.

The first and second conductor traces of a memristor crossbar array facilitate applying a programming signal (e.g., a voltage) to affect a change in the memristor bit connected between the first and second conductor traces. The change in the memristor bit produced by the programming signal may be understood in terms of oxygen migration within the memristor bit in some examples. For example, a boundary between a layer that is deficient in oxygen, e.g., an off-stoichiometric material layer, and another stoichiometrically stable layer (e.g., an oxide that is not oxygen deficient) may move as a result of exposure to the programming signal. The movement of the boundary may result from oxygen migration under the influence of the programming signal, for example. A final location of the movable boundary may establish a 'programmed' resistance of the memristor, for example.

Further, as used herein, the article 'a' is intended to have its ordinary meaning in the patent arts, namely 'one or more'. For example, 'a via' means one or more vias and as such, 'the via' means 'the vias' herein. Also, any reference herein to 'top', 'bottom', 'upper', 'lower', 'up', 'down', 'front', back', 'left', 'right', 'first' or 'second' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. The term 'substantially' as used herein means a majority, or almost all, or all, or an amount with a range of about 51% to 100%, for example. Moreover, examples herein are intended to be illustrative only and are presented for discussion purposes and not by way of limitation.

FIG. 1A illustrates a cross sectional view of a memristor 100 according to an example of the principles described herein. The memristor 100 comprises a memristor bit 120 disposed between a pair 110 of conductor traces. The memristor bit 120 includes a via portion 121 and a column portion 125 that is adjacent to the via portion 121. In particular, the column portion 125 is substantially aligned with the via portion 121. The via portion 121 is adjacent to a first conductor trace 111 of the pair 110 and the column portion 125 is adjacent to a second conductor trace 112 of the pair. The memristor bit 120 is surrounded on all sides by an interlayer dielectric material 130. In some examples, the first conductor trace is supported by a substrate 140; and the second conductor trace is supported by the interlayer dielectric material 130, for example. The first conductor trace 111 extends out of the page of FIG. 1A while the second conductor trace 112 is substantially perpendicular to the first conductor trace 111 to represent an example of a crossbar arrangement of the pair 110 of conductor traces with the memristor bit 120 therebetween. Moreover, the second conductor trace 112 may include an interconnect via 112a between the elongated second conductor trace 112 and the column portion 125 of the memristor bit 120.

The via portion 121 comprises a first electrode material 122 that fills a bulk of the via portion 121. The first electrode material 122 is in electrical contact with the first conductor trace 111. The via portion 121 further includes a switching layer 124 adjacent to the first electrode 122, and embedded in a surface portion of, the via portion 121 of the memristor bit 120. The switching layer 124 is a reacted species of the first electrode material 122 filling in the via portion 121, wherein being the reacted species facilitates providing the embedded characteristic of the switching layer 124.

The column portion 125 comprises a layer of a second electrode material 126 that has been patterned into a columnar shape substantially aligned with the via portion 121, for example, vertically aligned. The second electrode material 126 is in electrical contact with the second conductor trace 112. The second electrode material 126 may be the same as or different from the first electrode material 122. In some examples, the second electrode material 126 may comprise multiple layers of conductive materials that form a columnar-layered stack in the column portion 125. The column portion 125 is in electrical contact with the via portion 121.

The interlayer dielectric material 130 that surrounds the memristor bit 120 is an electrical insulator material that can be deposited and polished planar during manufacturing of the memristor 100. The interlayer dielectric material 130 includes, but is not limited to, a silicon oxide (e.g., silicon dioxide ($SiO_2$)), an aluminum oxide (e.g., alumina ($Al_2O_3$)), silicon nitride ($Si_3N_4$), or a combination of two or more thereof, for example. The substrate 140 that supports the first conductor trace 111 is a material including, but not limited to, a polymer, a ceramic, or a metal oxide. For example, the substrate material 140 includes, but is not limited to, silicon, silicon dioxide, silicon nitride, silicon carbide, or a high temperature polyimide. Other electrically nonconductive substrate materials also may be used.

The first conductor trace 111 comprises a conductive material on, or embedded in, a surface of the substrate 140. The first conductor trace 111 may be formed using a damascene process or using lithography techniques and etching, for example nanoimprint lithography. The second conductor trace 112 comprises a conductive material supported on the interlayer dielectric material 130. The via interconnect 112a portion of the second conductor trace 112 physically contacts the second electrode 126 of the column portion 125 of the memristor bit 120 to provide the electrical connection with the second conductor trace 112. The second conductor trace 112 may be formed using a dual damascene process, or using lithography and etching, for example.

Figure 1B:
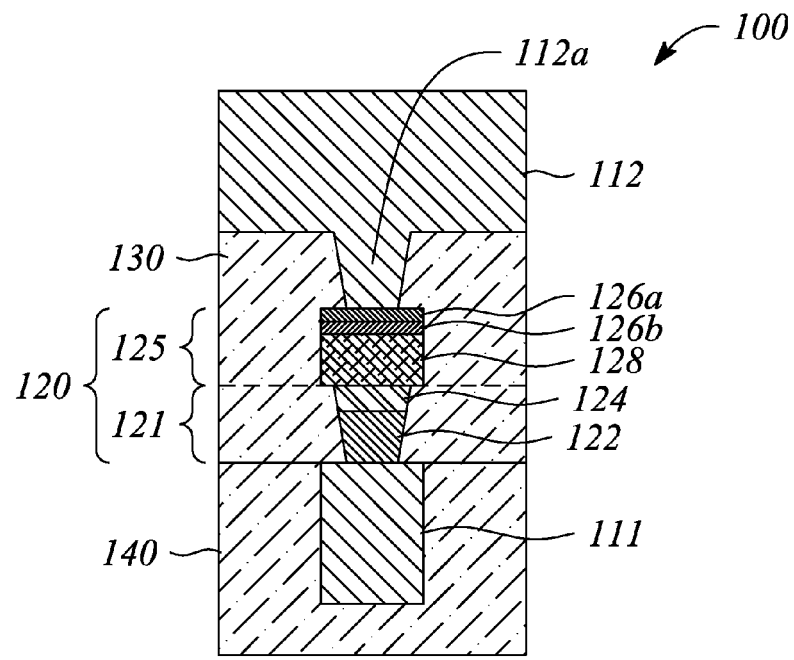
FIG. 1B illustrates a cross sectional view of a memristor, according to another example consistent with the principles described herein.

In some examples, the second electrode material 126 may include stacked layers of a conductive material and a diffusion barrier material. Inclusion of a diffusion barrier material in the second electrode 126 depends in part on the material used for the second conductor trace 112, for example. In some examples, the column portion 125 may further comprise a layer of a vacancy reservoir material in the column of stacked layers. The vacancy reservoir material layer comprises a different conductive material than the second electrode material 126. Further in these examples, the vacancy reservoir layer is located in the column portion 125 directly adjacent to and in physical or electrical contact with the switching layer embedded in the via portion 121, and the second electrode material 126 is located in the stack adjacent to the vacancy reservoir layer. FIG. 1B illustrates a cross sectional view of a memristor 100 according to another example of the principles described herein. As illustrated in FIG. 1B, the second electrode 126 of the column portion 125 comprises a layer of a diffusion barrier material 126a and a layer of a conductive material 126b, by way of example. The column portion 125 further comprises a layer of a vacancy reservoir material 128 in the layered stack of the column portion 125 in accordance with this example.

Figure 1C:
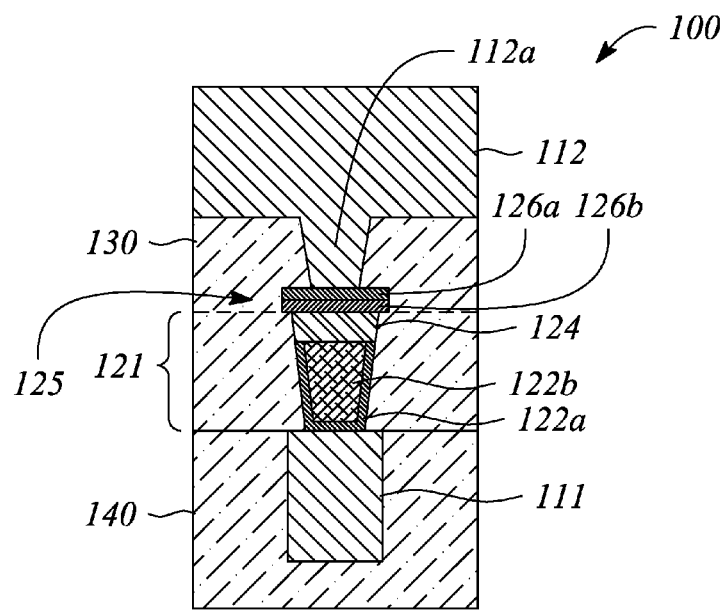
FIG. 1C illustrates a cross sectional view of a memristor, according to another example consistent with the principles described herein.

In some examples, the first electrode material 122 of the via portion 121 may comprise a conductive material and a diffusion barrier material, where the diffusion barrier material coats internal walls and a floor of the via portion 121, and the conductive material fills the bulk of the via portion 121. In this example, both the conductive material and to a lesser extent, the diffusion barrier material, facilitate formation of the embedded switching layer 124. In particular, both the conductive material at the via surface and diffusion barrier material exposed at the via surface are reactants that form the embedded switching layer. In some of these examples, the conductive material that may fill the bulk of the via portion 121 includes, but is not limited to, a vacancy reservoir material. FIG. 1C illustrates a cross sectional view of a memristor 100, according to another example of the principles described herein. As illustrated in FIG. 1C, the first electrode material of the via portion 121 comprises a diffusion barrier material 122a that coats the walls and floor of the via portion 121 and a conductive material 122b, for example a vacancy reservoir material or another electrode material, that fills the bulk of the via portion 121. The embedded switching layer 124 is a reacted species of both the diffusion barrier material 122a and the vacancy reservoir material 122b or other electrode material via fill. The column portion 125 comprises the second electrode 126 that comprises a conductive layer 126b adjacent to the switching layer 124 and in some examples, a diffusion barrier layer 126a between the conductive layer 126b and the interconnect via 112a of the second conductor trace 112. As mentioned above, inclusion of the diffusion barrier layer 126a is dependent in part on the material used for the second conductor trace 112 and the corresponding interconnect 112a.

The via portion 121 of the memristor 100 includes a via that may have a cross sectional shape that is flat or curved as in a cylinder having sidewalls that are parallel, tapered inward or outward, or a combination thereof along a length or height of the via. The column portion 125 of the memristor 100 includes a column that may have a cross sectional shape that is flat as in a flat-sided column having sidewalls that are substantially parallel. In some examples, the sidewalls of the column may include an irregular, slightly flared part, as a result of the manufacturing methods used to form the column portion 125. In some examples, the cross sectional shapes of the via portion and the column portion may be substantially similar, and may depend in part on the manufacturing methods used.

FIGS. 1A-1C illustrate, by way of example, the column portion 125 of the memristor 100 with a cross sectional dimension, for example one or more of width, length, aspect ratio or other dimension, that is discernibly different from a corresponding dimension of the via portion 121, according to some examples of the principles described herein. For example, FIGS. 1A-1C illustrate the via portion 121 comprising a truncated cone having a relatively tapered cross section and the column portion 125 comprising a relatively constant vertical sidewall cross section, by way of example and not limitation. In other examples, in cross section, the dimension might be that the via portion 121 is one or both of taller and narrower than a height or width of the column portion 125, with or without the via portion 121 having a tapered cross section for example; or that the column portion 125 is one or both of taller and wider than a height or width of the via portion 121, again with or without the via portion 121 having a tapered cross section. In some examples, the cross sectional feature that may be different is a tapered cone shape of the via portion 121 verses substantially vertical walls of the column portion 125. FIGS. 1A-1C illustrate some cross sectional differences between the via portion 121 and the column portion 125 by way of example. In particular, the via portion 121 is formed independently of the column portion 125, uses different manufacturing techniques to form the via, and may use different materials from those used to form the column portion 125. These different techniques, materials and independent formation may manifest themselves in a cross sectional view of the memristor device that has characteristically, discernibly different portions 121, 125 in some examples.

In some examples of the principles described herein, a plurality of the memristor 100 may be located at cross points between a first array of parallel conductor traces and a second array of parallel conductor traces that cross over each other at non zero angles of a memristor crossbar array. In these examples, the conductor traces 111, 112 of the pair 110 are respective members of the arrays of parallel conductor traces.

Figure 2:
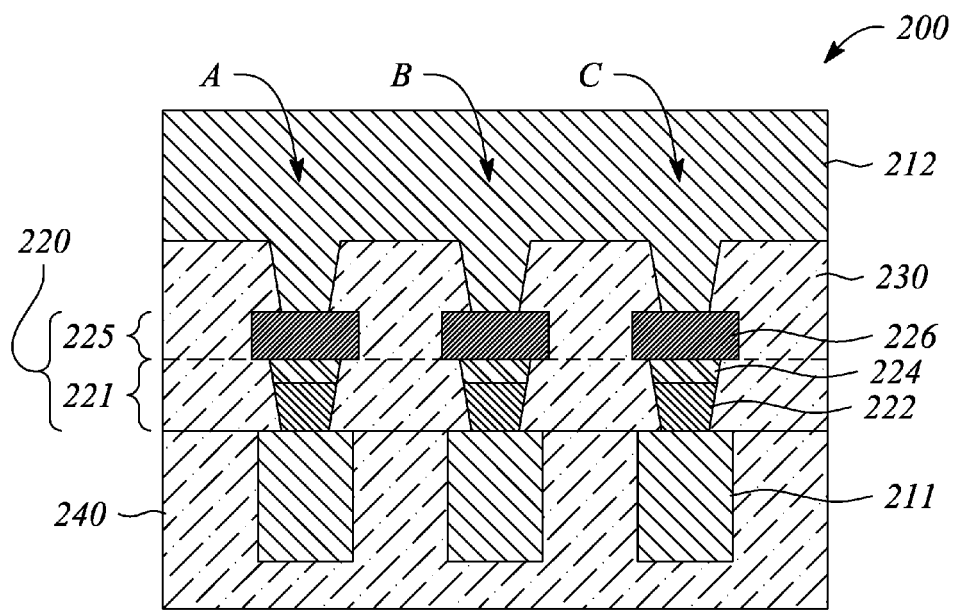
FIG. 2 illustrates a cross sectional view of a memristor crossbar array, according to an example consistent with the principles described herein.

FIG. 2 illustrates cross sectional view of a memristor crossbar array 200, according to an example of the principles described herein. The crossbar array 200 comprises a plurality of memristor bits 220 located at cross points between a first array of conductor traces 211 and a second array of conductor traces 212. FIG. 2 illustrates three such cross points labeled A, B and C, by way of example. The first array of conductor traces 211 is supported by a substrate 240. Moreover, the plurality of memristor bits 220 is surrounded by a dielectric material 230. In some examples, the conductor traces 211, 212 of the respective arrays are substantially similar to the conductor traces 111, 112 described above with respect to the memristor 100. A memristor bit 220 of the plurality comprises a via portion 221 and a column portion 225. In some examples, the column portion 225 has a characteristically discernible different cross sectional dimension from a corresponding dimension of the via portion 221. For example, the column portion 225 has a cross sectional width that is wider than a corresponding cross section width of the via portion 221 in the illustrated example in FIG. 2. In some examples (not illustrated), the corresponding cross sectional dimensions of the via portion and the column portion are not manifested as discernibly different.

The via portion 221 of the memristor bit 220 of the crossbar array 200 comprises a first electrode material 222 and an embedded switching layer 224. The column portion 225 comprises a second electrode material 226. In some examples, the first electrode material 222 comprises a diffusion barrier material that coats the internal walls and floor of the via portion 212 and a conductive material that fills the via portion 221. In some examples, the conductive material that fills the bulk of the via portion 221 is or comprises a vacancy reservoir material. The embedded switching layer 224 is a reacted species of the first electrode material. In some examples, the second electrode material 226 comprises a layer of a conductive material. In some examples, the second electrode material 226 comprises a conductive material layer and a diffusion barrier layer stacked on the conductive material layer. In some examples, the column portion 225 further comprises a layer of a vacancy reservoir material stacked with the second electrode 226. The vacancy reservoir layer is adjacent to the embedded switching layer 224 of the via portion 221 and the second electrode material 226 is stacked on the vacancy reservoir layer in the column portion 225. In some examples, the memristor bit 220 is substantially similar to any of the examples of the memristor bit 120 described above for the memristor 100.

The memristor crossbar array 200 further includes the dielectric material 230 that substantially fills an interstitial space below the conductor traces 212 of the second plurality of parallel conductor traces and between adjacent memristor bits 220 arranged in rows and columns along crossbar array 200, as illustrated in FIG. 2. The dielectric material 230 facilitates electrical isolation between adjacent memristor bits 220 in the row and the columns. Moreover, the dielectric material 230 supports the conductor traces 212 of the second plurality. In some examples, the dielectric material 230 is substantially similar to the interlayer dielectric material 130 of the memristor 100 described above.

Figure 3:
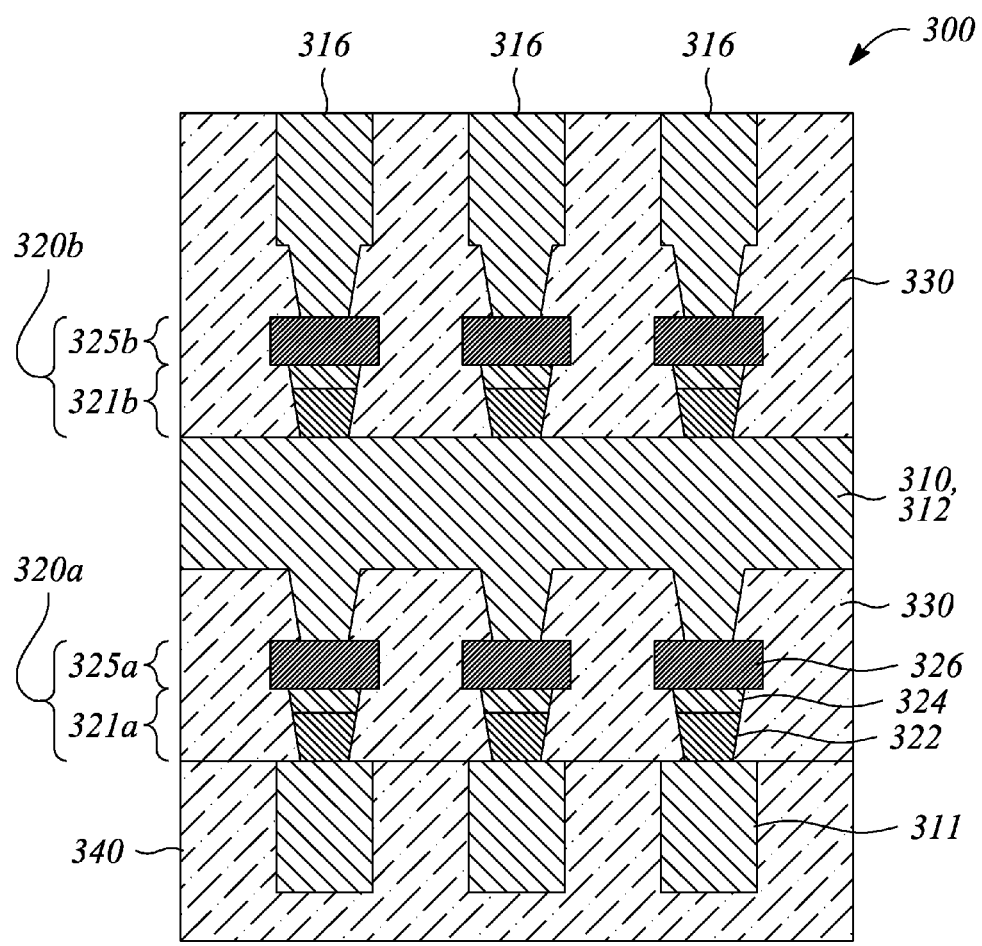
FIG. 3 illustrates a cross sectional view of a memristor crossbar array, according to another example consistent with the principles described herein.

FIG. 3 illustrates a cross sectional view of a memristor crossbar array 300, according to another example consistent with the principles described herein. The memristor crossbar array 300 comprises an array 310 of conductor traces shared between stacked pluralities of memristor bits 320a, 320b that are surrounded by a dielectric material 330. The memristor bits 320a, 320b comprise respective via portions 321a, 321b and column portions 325a, 325b aligned with the via portions. The shared array 310 of conductor traces is both a second array of conductor traces 312 for the plurality of memristor bits 320a and a first array of conductor traces 312 for the plurality of memristors 320b. The memristor crossbar array 300 further comprises an array of first conductor traces 311 to memristor bits 320a that are opposite to the shared array 310. The first conductor traces 311 are supported by a substrate 340. The memristor crossbar array 300 further comprises an array of third conductor traces 316 that are opposite to the shared array 310 of the memristor bits 320b. In particular, the array of third conductor traces 316 are in a substantially parallel but spaced apart plane from the array of first conductor traces 311 and the array of second conductor traces 312. As illustrated by way of example, the array of third conductor traces 316 crosses the shared, second conductor traces 312 at a nonzero angle, which may be the same or a different nonzero angle from that which the arrays of first and second conductor traces 311, 312 cross each other.

The memristor crossbar array 300 and the memristor bits 320a, 320b of FIG. 3 may be substantially similar to any of the memristor bits 120 described above with respect to the memristor 100 or the memristors bits 220 of the memristor crossbar array 200. The stacked memristors bits 320a, 320b may increase a density of the crossbar array in a memory device, for example. Moreover, the shared array 310 of conductor traces may eliminate one or more processing steps and associated materials. In an example of the memristor crossbar array 300, the first electrode material 322 that fills the via portion 321a, 321b comprises tantalum nitride (TaN), and the switching layer 324 comprises a nonconductive, stoichiometrically stable tantalum oxide (Ta$_x$O$_y$). Moreover, the second electrode 326 comprises one or both of titanium nitride (TiN) and TaN, for example. The use of both TiN and TaN is dependent on whether the conductor traces 312, 316 in contact with the second electrode 326 are made of a conductive material with migration issues, e.g., copper (Cu), that dictate the use of a diffusion barrier layer (e.g., TaN). In fact, the use of TaN for the first electrode material 322 addresses potential migration issues when the first conductor traces 311 are made of Cu or another conductive material having migration issues, for example.

Figure 4:
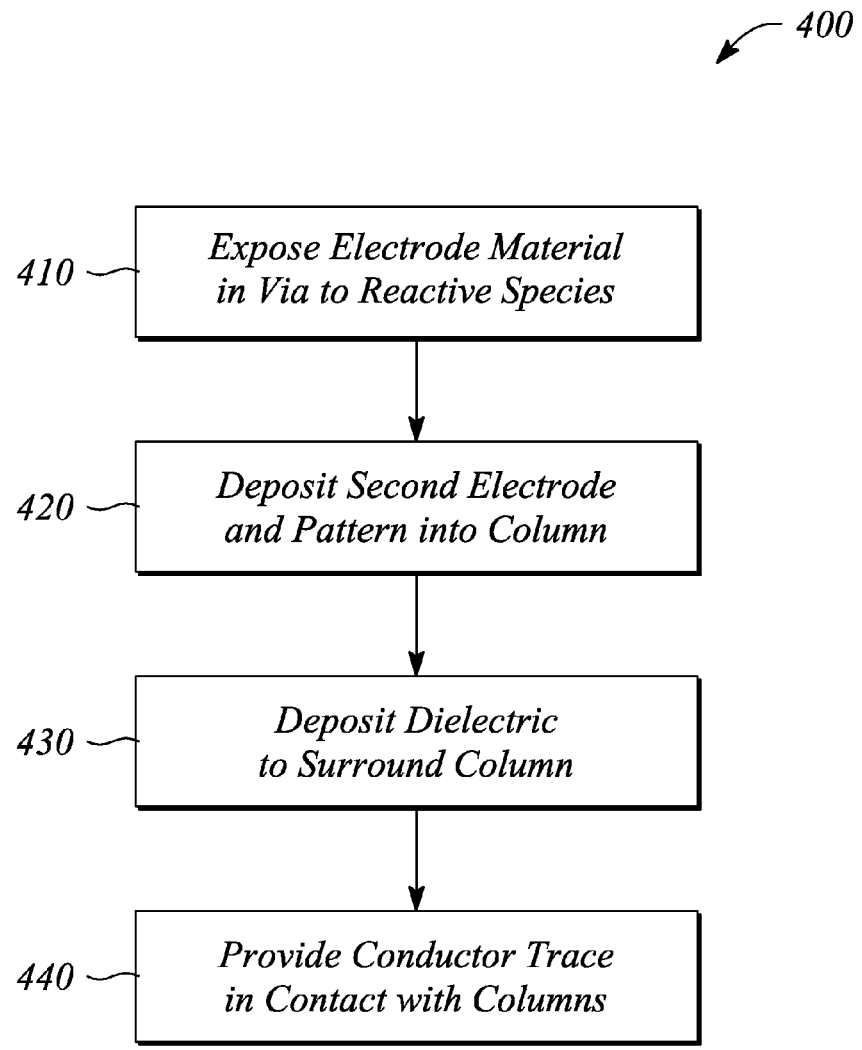
FIG. 4 illustrates a flow chart of a method of making an embedded switching layer in a memristor, according to an example consistent with the principles described herein.

FIG. 4 illustrates a flow chart of a method 400 of making a memristor with an embedded switching layer, according to an example in accordance with the principles herein. In particular, the memristor made by the method 400 comprises a switching layer embedded in a via portion of a memristor bit disposed between a pair of conductor traces. The via portion includes a first electrode of the memristor bit that is adjacent to a first conductor of the memristor. The method 400 of making a memristor comprises exposing 410 a surface portion of a first electrode material that fills a bulk of a via to a reactive species to form a switching layer embedded within a surface of the via. For example, the first electrode material is exposed 410 to an oxygen plasma to oxidize a surface of the first electrode material in the via for a portion of a depth of the via at the surface (i.e., herein 'surface portion'). The switching layer is formed from the first electrode material in the via. The via and the first electrode material-via fill is in contact with a first conductor trace of the pair. The first conductor trace provides an electrical connection to the memristor bit at a first end of the memristor bit.

The method 400 of making a memristor with an embedded switching layer further comprises depositing 420 a layer of a second electrode material adjacent to the via surface portion (comprising the switching layer) and patterning the second electrode layer into a column substantially aligned with the via. As a result of the deposition and patterning, the patterned column may have a cross sectional dimension that is discernibly or characteristically different from a corresponding cross sectional dimension of the via in some examples. In other examples, the corresponding cross sectional dimensions may not be substantially discernible or characteristically different. After the second electrode layer is patterned into the column, the method 400 further comprises depositing 430 a dielectric material to surround the column. For example, a chemical vapor deposition process may be used to deposit the dielectric material. In some examples, the deposited 430 dielectric material is rendered planar with a height of the column to facilitate keeping exposed the second electrode material of the column at a second end of the memristor bit. For example, chemical mechanical polishing (CMP) may be used to render the surface planar. In some examples, the dielectric material is deposited 430 to surround and cover the column. The method 400 of making a memristor further comprises providing 440 a second conductor trace in electrical contact with the column of second electrode material. The second conductor trace provides an electrical connection to the memristor bit at the second end. The second conductor trace may be provided 440 e.g., using a dual damascene process. In other examples, the second conductor trace is provided 440 using one or more of lithography, etching and a deposition process. For example, a blanket layer of the conductive material used for the second conductor trace may be deposited over the surface and masking with either a lift-off process or etching may be used to define the second conductor trace. In another example, the dielectric material may be patterned with a trench in which the conductive material of the second conductor trace is deposited. The dielectric material surrounding the column supports the second conductor trace.

In some examples, before exposing 410 the surface portion of the filled via to a reactive species, the method 400 of making an embedded switching layer further comprises forming the via in a first dielectric layer that covers the first conductor trace. In some examples, the via is formed using lithography and etching, for example using one or both of wet chemical etching and dry etching (e.g., reactive ion etching (RIE)). After the via is formed in the first dielectric layer, the method 400 further comprises filling the via with the first electrode material. In some examples, the via is filled with the first electrode material by deposition using a chemical vapor deposition (CVD) process, sputtering, atomic layer deposition (ALD) or another deposition method, for example. In some examples, the first electrode material may be deposited through a mask aligned with the via and for example, removal of the mask also removes excess first electrode material that deposited outside of the vias by way of a lift off process. In some examples, the mask used to fill the via and provide lift off may be the same mask used to form the via in the first dielectric layer. In some examples, the same mask may be used to define interconnect locations for the second conductor trace to the second electrode material. Such multiple use of the mask obviates potential alignment issues during manufacturing.

Depending on how the via is filled with the first electrode material, the method 400 may further comprise rendering the first electrode material in the via substantially planar with a surface of the first dielectric layer. In some examples, the first electrode material may be rendered substantially planar with the first dielectric layer surface using CMP or another procedure. In some example, the first conductor trace may be supported by a substrate and covered by the first dielectric layer. The via is formed through the first dielectric layer to access the first conductor trace at a predetermined location. In some examples, the first conductor trace is embedded in the substrate except for a surface of the first conductor trace to which electrical contact is to be made. In some examples, the method 400 further comprises depositing the first dielectric layer on the substrate surface to cover the first conductor trace. The first dielectric layer may be deposited on the substrate surface using e.g., a CVD process or another deposition technique.

In some examples, the method 400 further comprises forming the substrate comprising the first conductor trace. In some examples, the substrate comprising the first conductor trace is formed by depositing a layer of a material of the first conductor trace using a technique including, but not limited to, electrodeposition, sputtering, evaporation and a CVD process, such as plasma enhanced CVD (PECVD), for example. In some examples, the layer may be patterned into the first conductor trace on the substrate by using lithography and etching or by using a damascene process.

In some examples, filling the via with the first electrode material comprises depositing a diffusion barrier material that coats internal walls and a floor of the via. Moreover, filling the via further comprises depositing a conductive material on the diffusion barrier material and to fill the via. Use of a diffusion barrier material depends in part on the choice of conductive material used for the first conductor trace. Deposition techniques including, but not limited to, one or more of electrodeposition, sputtering, evaporation and a CVD process may be used for the first and second depositions. In this example, exposing 410 the first electrode material to a reactive species comprises exposing both the conductive material via fill as well as exposed portions of the diffusion barrier material that coats the internal walls to the reactive species to form the embedded switching layer that comprises a reacted species of both the conductive material and to a lesser extent, the diffusion barrier material.

In some examples, before depositing 440 a layer of second electrode material, a layer of a vacancy reservoir material is deposited on the dielectric layer surface that includes the surface portion of the embedded switching layer within the via. In some examples, depositing 440 the second electrode layer comprises depositing a layer of a conductive material on the vacancy reservoir layer to cover the vacancy reservoir layer. In some examples, a diffusion barrier layer is further deposited on the conductive material layer, where the inclusion of the diffusion barrier layer may depend in part on the conductive material used for the second conductor trace. As such, patterning the second electrode layer into a column comprises patterning the stack of layers into the column, in some examples. Deposition techniques including, but not limited to, one or more of electrodeposition, sputtering, evaporation and a CVD process may be used for depositions of the vacancy reservoir material and the second electrode material layers. The column may be patterned using lithography and etching, for example.

In some examples, the method 400 of making an embedded switching layer in memristor is used to make the memristor 100, according to any of the examples thereof described above. Accordingly, the memristor manufactured using the method 400 comprises a memristor bit that comprises a first electrode via portion comprising the embedded switching layer and a second electrode column portion. Moreover, in some examples, the memristor manufactured using the method 400 includes the column portion with a cross sectional dimension that may be discernibly different from a corresponding cross sectional dimension of the via portion, as described above.

Figure 5:
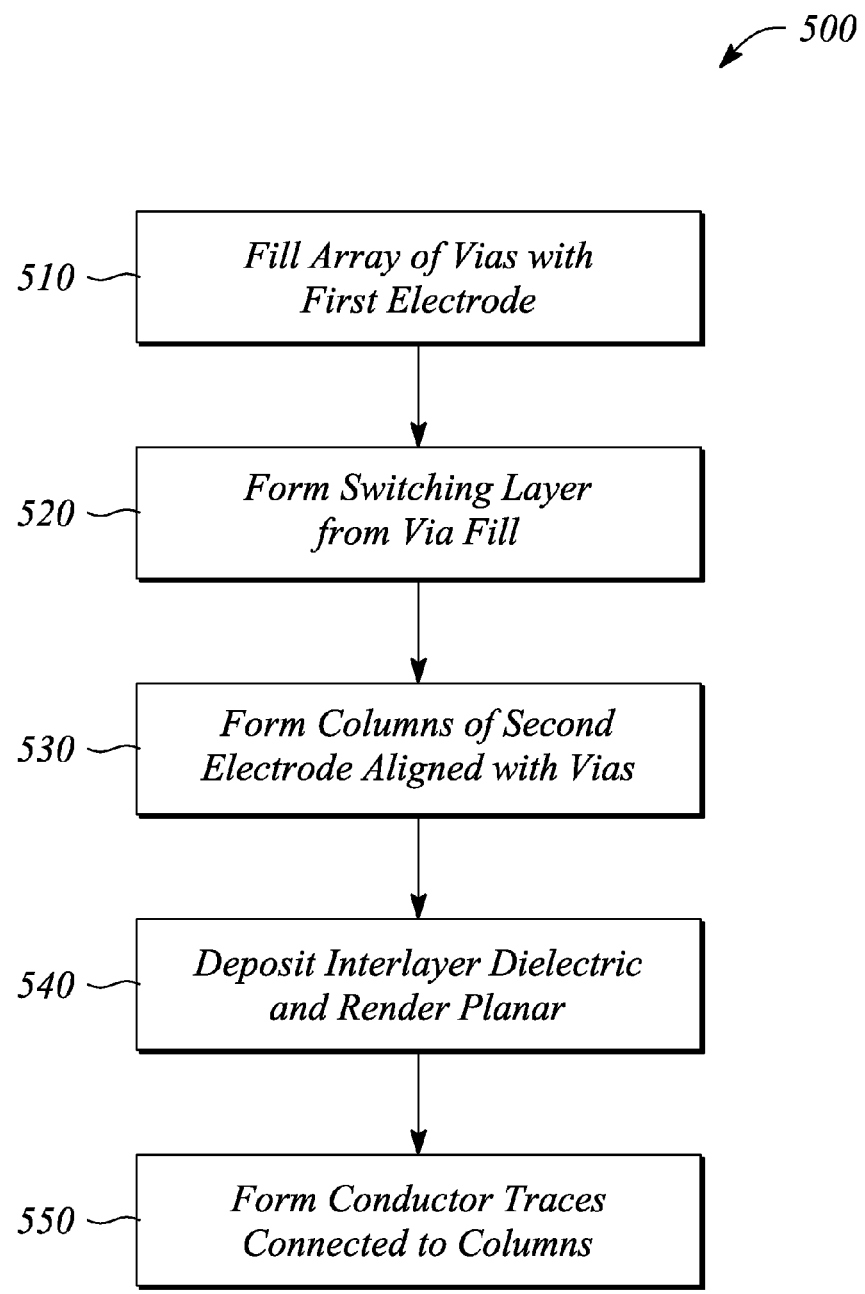
FIG. 5 illustrates a flow chart of a method of making a memristor crossbar array, according to an example consistent with the principles described herein.
Figure 6A:
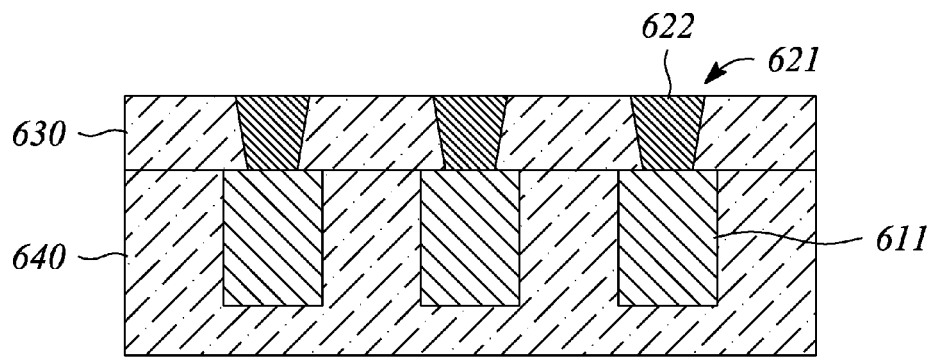
FIGS. 6A-6E illustrate cross sectional views of a memristor crossbar array made according to the method of FIG. 5, according to an example consistent with the principles described herein.

FIG. 5 illustrates a flow chart of a method 500 of making a memristor crossbar array, according to an example of the principles described herein. FIGS. 6A-6E illustrate cross sectional views of a memristor crossbar array being made according the method 500 of FIG. 5, according to an example of the principles described herein. The method 500 of making the crossbar array of FIG. 5 comprises filling 510 an array of vias in a dielectric layer with a first electrode material. FIG. 6A illustrates the dielectric layer 630 overlying a substrate 640 including a first plurality of parallel conductor traces 611. The array of vias 621 extends through the dielectric layer 630 to access the underlying first plurality of conductor traces 611. The first electrode material 622 that fills 510 the vias 621 is in electrical contact with the conductor traces 611 of the first plurality. In some examples, filling 510 the array of vias comprises depositing the first electrode material into the vias that includes overfilling the vias such that the first electrode material is also deposited on a surface of the dielectric layer (not illustrated). The first electrode material on the dielectric layer surface is removed and the first electrode material-via fill is rendered substantially planar with a surface of the dielectric layer, for example using CMP, or another procedure such as a lift-off masking process. FIG. 6A illustrates the planar surface of the dielectric layer 630 and the filled vias 621.

Figure 6B:
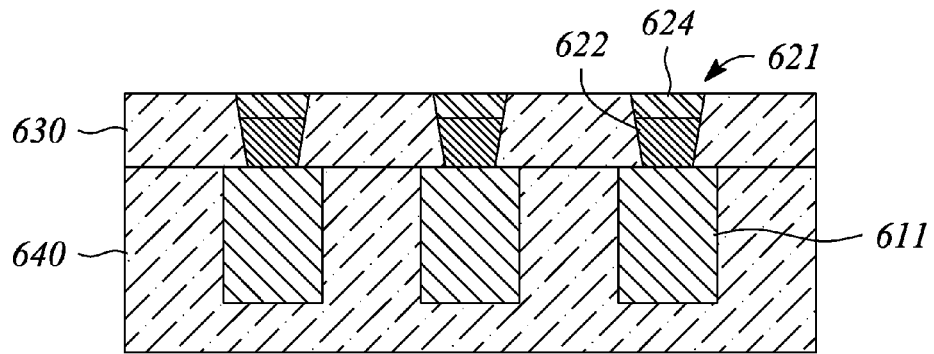

The method 500 of making a memristor crossbar array further comprises forming 520 a switching layer embedded in a surface of the vias from the first electrode material-via fill. The embedded switching layer is formed 520 by exposing a surface portion of the first electrode material-via fill in the vias to a reactive species that converts the surface portion of the first electrode material in the vias to the switching layer embedded in the via surface. FIG. 6B illustrates the embedded switching layer 624 in the surface portion of the vias 621, as formed from the first electrode material 622 that occupied the surface portion before the switching layer was formed 520. For example, the surface portion of the first electrode material-via fill may be exposed to an oxygen ($O_2$) plasma or an ozone ($O_3$) rich environment to oxidize the surface portion of the first electrode material to a substantially stoichiometric oxide-switching layer of the first electrode-via fill metal. For example, a first electrode material including, but not limited to, one or both of titanium nitride (TiN) and tantalum nitride (TaN) in the vias may be reacted with the reactive oxygen species to form an embedded switching layer respectively comprising one or both of $TiO_2$ and $Ta_2O_5$, for example. In another example, a nitrogen-based reactive species may be used to convert a conductive material (e.g., Ti, TiN, Ta, TaN, or Al) to a substantially stoichiometric nitride-switching layer (e.g., $Ti_xN_y$, $Ta_xN_y$, or $Al_xN_y$), where x and y are values such that the switching layer is electrically nonconductive and stoichiometrically stable, for example.

The method 500 of making a memristor crossbar array further comprises forming 530 columns of a second electrode material that are substantially vertically aligned with the array of vias. In some examples, the second electrode material of the columns is adjacent to the embedded switching layer of the vias. The second electrode material includes a conductive material and may further include a diffusion barrier material, for example. In some examples, forming 530 columns comprises depositing a layer of the second electrode material on the surface of the dielectric layer that covers the array of vias. For example, a layer of a conductive material is first deposited and then a layer of a diffusion barrier may be deposited on the conductive material to form the second electrode layer.

Figure 6C:
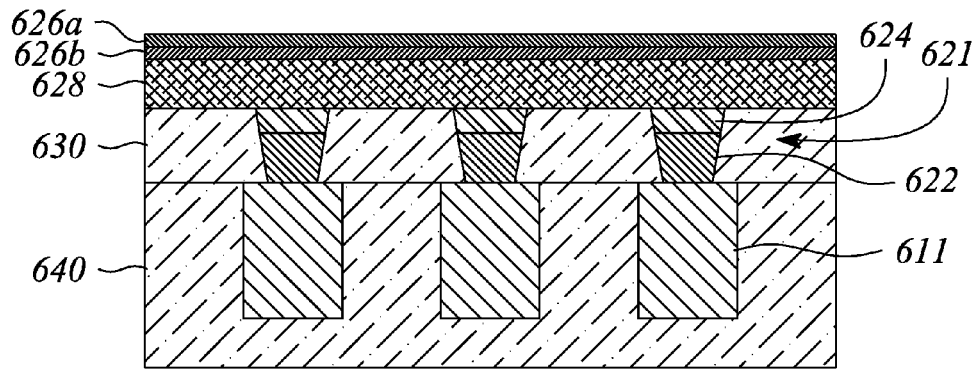

In some examples, forming 530 columns further comprises depositing a layer of a vacancy reservoir material on the surface of the dielectric layer that covers the array of vias to be directly adjacent to the switching layer in the vias. In this example, the layer of the second electrode material is deposited on the vacancy reservoir layer and is indirectly adjacent to the embedded switching layer. The second electrode material and the vacancy reservoir material may be deposited using deposition techniques including, but not limited to, sputtering, evaporation, CVD, or PECVD, for example. FIG. 6C illustrates the deposition of layers on the surface of the dielectric layer 630 and on the embedded switching layer 624 of the vias 621 on the substrate 640. The deposited layers illustrated in FIG. 6C include the vacancy reservoir layer 628 adjacent to the switching layer 624, the conductive material layer 626b on the vacancy reservoir layer 628 and the diffusion barrier layer 626a on the conductive material layer 626b, by way of example. In some examples, one or both of the vacancy reservoir layer 628 and the diffusion barrier layer 626a are omitted.

Forming 530 the columns further comprises patterning the layer of second electrode material (whether a single layer or multiple stacked layers of second electrode material with or without the vacancy reservoir layer) into columns adjacent to and aligned with the array of vias to form memristor bits. Patterning includes, but is not limited to, using one or both of lithography techniques (e.g., photolithography) and etching techniques (e.g., one or both of wet and dry etch techniques) to form 530 the columns.

Figure 6D:
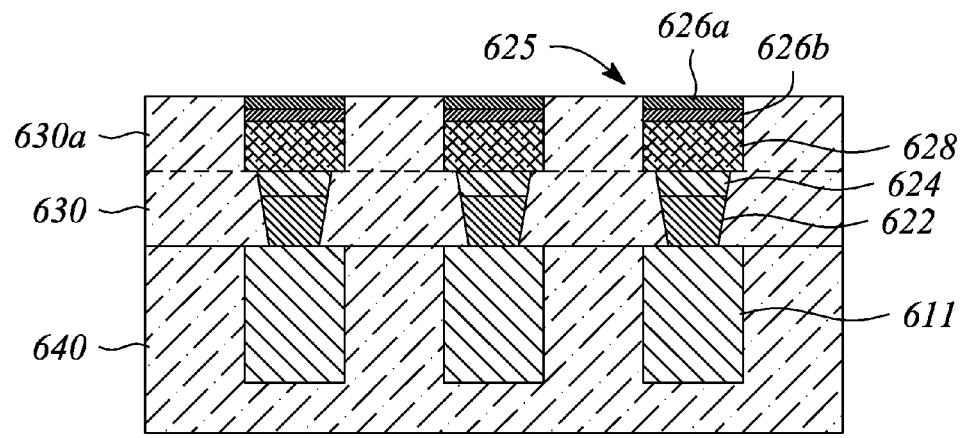

The method 500 of making a memristor crossbar array further comprises depositing 540 an interlayer dielectric material on the surface of the dielectric layer to surround the columns. In some examples, the interlayer dielectric material also covers the columns when deposited 540. In some of these examples, the interlayer dielectric material is rendered substantially planar with a height of or a surface of the columns, for example the surface opposite to the surface of the vias. The interlayer dielectric material may be rendered planar with the column height using CMP, for example, or another procedure. The substantially planar interlayer dielectric material exposes the column surfaces for subsequent interconnection. FIG. 6D illustrates patterned columns 625 aligned over the vias 621 through the dielectric 630 on the substrate 640. The columns 625 are surrounded by the interlayer dielectric material 630a that has been rendered planar, in this example. The patterned columns 625 comprise stacked layers of the vacancy reservoir material 628 and the second electrode material 626a, 626b, for example. The vias 621 comprise the embedded switching layer 624 and the first electrode material-via fill 622 in contact with the first conductor traces 611.

The method 500 of making a memristor crossbar array further comprises forming 550 a second plurality of parallel conductor traces in electrical contact with the columns. In some examples, forming 550 a second plurality of parallel conductor traces comprises using a dual damascene process to form and interconnect the second plurality of conductor traces to the second electrode material of the columns. In other examples, forming 550 the second plurality of parallel conductor traces comprises depositing a layer of a dielectric material on the substantially planar surface to cover the exposed second ends of the memristor bits; and forming interconnect vias in the dielectric layer vertically aligned with the memristor bits to access the second ends. For example, a mask that may have been used to form the vias of the memristor bits also may be used to form the interconnect vias of the second plurality of parallel conductor traces. After the vias are formed through the deposited dielectric layer, forming 550 the second plurality of parallel conductor traces further comprises depositing a conductor trace material to fill the vias and cover a surface of the deposited dielectric layer. For example, one or more of electrodeposition, a CVD process, sputtering, and evaporation may be used. The deposited conductor trace material is then patterned into the parallel conductor traces of the second plurality at a non-zero angle to the first plurality of parallel conductor traces.

Figure 6E:
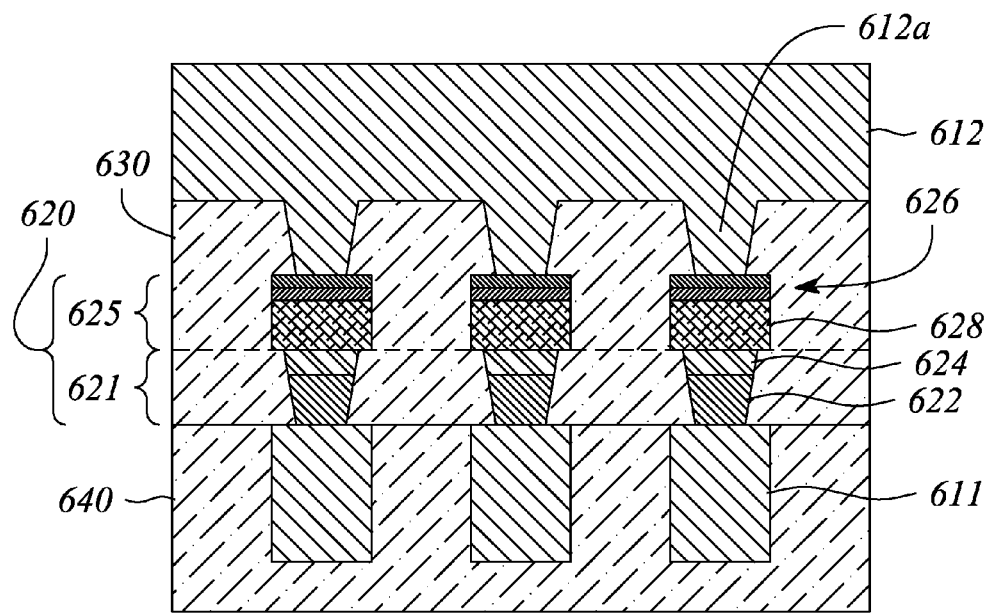

FIG. 6E illustrates the formed 550 second conductor traces 612 having an interconnect portion 612a that connects to the second electrode material 626 of the columns 625 of the memristor bits 620. The first and second pluralities of parallel conductor traces 611, 612 are arranged in a crossbar pattern with the memristor bits 620 between the first and second pluralities at cross points. The second plurality of parallel conductors 612 are arranged to intersect the memristor bits 620 at a second end and at the non-zero angle to the first plurality of parallel conductor traces 611. For example, the second plurality of parallel conductor traces 612 are in a plane parallel to the first plurality of parallel conductor traces 611, spaced apart by the memristor bits 620, and substantially perpendicular to a direction of the parallel conductor traces of the first plurality 611. In some examples, the memristor crossbar array made by the method 500 herein is substantially similar to the memristor crossbar array 200 illustrated in FIG. 2.

Thus, there have been described examples of a memristor having an embedded switching layer, a crossbar array employing the memristor and methods of making the same. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of making a memristor with an embedded switching layer, the method comprising:
    exposing a surface portion of a first electrode material within a via to a reactive species to form a switching layer embedded within and at a surface of the via, the via being in contact with a first conductor trace;
    depositing a layer of second electrode material adjacent to the via surface and patterning the second electrode layer into a column aligned with the via;
    depositing an interlayer dielectric material to surround the column; and
    providing a second conductor trace in electrical contact with the second electrode material of the column.

2. The method of making a memristor with an embedded switching layer of claim 1, further comprising:
    forming the via in a dielectric layer that covers the first conductor trace, the first conductor trace being supported by a substrate;
    filling the via with the first electrode material; and
    rendering the first electrode material in the via substantially planar with a surface of the dielectric layer before exposing a surface portion of the first electrode material to a reactive species.

3. The method of making a memristor with an embedded switching layer of claim 1, wherein the first electrode material comprises a diffusion barrier material that coats internal walls and a floor of the via; and a conductive material that fills a bulk of the via, the embedded switching layer comprising reacted species of both the diffusion barrier material and the conductive material.

4. The method of making a memristor with an embedded switching layer of claim 1, wherein the first electrode material comprises a vacancy reservoir material, the embedded switching layer comprising a reacted species of the vacancy reservoir material.

5. The method of making a memristor with an embedded switching layer of claim 1, further comprising:
    depositing a layer of a vacancy reservoir material on the surface that includes the surface portion of the switching layer within the via before depositing a layer of second electrode material, wherein patterning the second electrode layer comprises patterning the vacancy reservoir layer along with the second electrode layer into stacked layers of the column.

6. The method of making a memristor with an embedded switching layer of claim 1, wherein depositing a layer of second electrode material comprises:
depositing a layer of a conductive material; and
depositing a layer of a diffusion barrier material on the conductive material layer, the diffusion barrier layer being adjacent to the second conductor trace, and
wherein patterning the second electrode layer comprises patterning the conductive layer and the diffusion barrier layer into stacked layers of the column.

7. The method of making a memristor with an embedded switching layer of claim 1, wherein the reactive species comprises oxygen or nitrogen to convert the first electrode material in the surface portion to the embedded switching layer.

8. A method of making a memristor crossbar array comprising:
filling an array of vias in a dielectric layer with a first electrode material, the vias accessing a first plurality of parallel conductor traces;
forming an embedded switching layer from the first electrode material in a surface of the vias;
forming columns aligned with the array of vias, the columns being adjacent to the embedded switching layer and comprising a second electrode material;
depositing and rendering an interlayer dielectric material planar with a surface of the columns; and
forming a second plurality of parallel conductor traces in electrical contact with the columns, the first and second pluralities of conductor traces being in a crossbar pattern.

9. The method of making a memristor crossbar array of claim 8, wherein forming an embedded switching layer comprises exposing a surface portion the first electrode material in the vias to a reactive species to form a reacted species of the first electrode material embedded in the surface of the vias.

10. The method of making a memristor crossbar array of claim 8, wherein forming columns aligned with the array of vias comprises:
depositing a layer of the second electrode material on the dielectric layer to cover the array of vias; and
patterning the conductive material layer into the columns adjacent to and aligned with the array of vias to form memristor bits.

11. The method of making a memristor crossbar array of claim 10, wherein the patterned columns have a cross sectional dimension that is different from a corresponding cross sectional dimension of the vias.

12. The method of making a memristor crossbar array of claim 8, wherein forming columns aligned with the array of vias comprises:
depositing a layer of a vacancy reservoir material on the dielectric layer to cover the array of vias, the vacancy reservoir layer being adjacent to the embedded switching layer in the vias;
depositing a layer of the second electrode material on the vacancy reservoir layer; and
patterning the deposited layers into columns of stacked layers.

13. A memristor comprising:
a memristor bit disposed between a pair of conductor traces, the memristor bit comprising:
a via portion comprising a first electrode material adjacent to a first conductor trace of the pair, a surface of the via portion opposite to the first conductor trace comprising an embedded switching layer, the embedded switching layer comprising a reacted species of the first electrode material in the via portion; and
a column portion comprising a columnar stack of a layer of a vacancy reservoir material and a layer of a second electrode material between the via portion and a second conductor trace of the pair, the vacancy reservoir layer being directly adjacent to the embedded switching layer of the via portion.

14. The memristor of claim 13, wherein the column portion has a different cross sectional dimension from a corresponding cross sectional dimension of the via portion.

15. A memristor crossbar array comprising a plurality of the memristor of claim 13, wherein the memristor crossbar array further comprises a first array of parallel conductor traces that comprises the first conductor trace and a second array of parallel conductor traces that comprises the second conductor trace, the second array being spaced from and crossing the first array at a nonzero angle, and wherein memristor bits of the plurality of the memristor are located at cross points between conductor trace pairs from the first array and the second array.

* * * * *

UNITED STATES PATENT AND TRADEMARK OFFICE
CERTIFICATE OF CORRECTION

| | |
|---|---|
| PATENT NO. | : 8,658,463 B2 |
| APPLICATION NO. | : 13/562063 |
| DATED | : February 25, 2014 |
| INVENTOR(S) | : Janice H. Nickel et al. |

It is certified that error appears in the above-identified patent and that said Letters Patent is hereby corrected as shown below:

In the Claims

In column 15, line 39, in Claim 9, after "portion" insert -- of --.

Signed and Sealed this
Ninth Day of September, 2014

Michelle K. Lee
*Deputy Director of the United States Patent and Trademark Office*